(12) United States Patent
Corisis

(10) Patent No.: US 6,314,639 B1
(45) Date of Patent: *Nov. 13, 2001

(54) CHIP SCALE PACKAGE WITH HEAT SPREADER AND METHOD OF MANUFACTURE

(75) Inventor: David J. Corisis, Meridan, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/028,134

(22) Filed: Feb. 23, 1998

(51) Int. Cl.[7] .................................................. H01R 43/00
(52) U.S. Cl. ........................... 29/827; 257/704; 257/707; 257/708
(58) Field of Search ............................ 29/825, 827, 830, 29/831; 257/704, 707, 738, 778; 361/709, 719

(56) References Cited

U.S. PATENT DOCUMENTS

| | | |
|---|---|---|
| 4,024,570 | 5/1977 | Hartmann et al. . |
| 4,143,456 | 3/1979 | Inoue . |
| 4,264,917 | 4/1981 | Ugon . |
| 4,300,153 | 11/1981 | Hayakawa et al. . |
| 4,358,552 | 11/1982 | Shinohara et al. . |
| 4,507,675 | 3/1985 | Fujii et al. . |
| 4,642,671 | 2/1987 | Rohsler et al. . |
| 4,931,852 | 6/1990 | Brown et al. . |
| 4,961,107 | 10/1990 | Geist et al. . |
| 5,101,465 | 3/1992 | Murphy . |
| 5,173,764 | 12/1992 | Higgins, III . |
| 5,194,930 | 3/1993 | Papathomas et al. . |
| 5,214,845 | 6/1993 | King et al. . |
| 5,233,220 | 8/1993 | Lamson et al. . |
| 5,378,924 | 1/1995 | Liang . |
| 5,379,186 | 1/1995 | Gold et al. . |
| 5,379,187 | 1/1995 | Lee et al. . |
| 5,387,554 | 2/1995 | Liang . |
| 5,434,105 | 7/1995 | Liou . |
| 5,436,203 | 7/1995 | Lin . |
| 5,450,283 | 9/1995 | Lin et al. . |
| 5,488,254 | 1/1996 | Nishimura et al. . |
| 5,489,538 | 2/1996 | Rostoker et al. . |
| 5,489,801 | 2/1996 | Blish, II . |
| 5,490,324 | 2/1996 | Newman . |
| 5,528,076 | 6/1996 | Pavio . |
| 5,541,446 | 7/1996 | Kierse . |
| 5,550,408 | * 8/1996 | Kunitomo ............................ 257/737 |
| 5,559,306 | 9/1996 | Mahulikar . |
| 5,594,282 | 1/1997 | Otsuki . |
| 5,596,231 | 1/1997 | Combs . |
| 5,598,034 | 1/1997 | Wakefield . |
| 5,661,086 | 8/1997 | Nakashima et al. . |
| 5,708,567 | * 1/1998 | Shim ................................... 361/723 |
| 5,773,896 | 6/1998 | Fujimoto et al. . |
| 5,884,396 | 3/1999 | Lin . |
| 5,907,769 | * 5/1999 | Corisis ................................. 438/123 |

* cited by examiner

Primary Examiner—Carl J. Arbes
Assistant Examiner—Sean Smith
(74) Attorney, Agent, or Firm—TraskBritt

(57) ABSTRACT

A dense semiconductor flip-chip device is provided with a heat sink/spreading/dissipating member which is formed as a paddle of a metallic paddle frame in a strip of paddle frames. Dice are bonded to the paddles by e.g. conventional die attach methods, enabling bump attachment and testing to be conducted before detachment from the paddle frame strip.

13 Claims, 3 Drawing Sheets

CHIP SCALE PACKAGE WITH HEAT SPREADER AND METHOD OF MANUFACTURE

BACKGROUND OF THE INVENTION

1. Field of the Invention

This invention relates generally to semiconductor device assemblies. More particularly, the invention pertains to a method for producing a chip-on-board semiconductor device assembly with a heat spreading/dissipating member, and the device produced thereby.

2. State of the Art

In the design and production of modern integrated circuits (IC), an important consideration is the dissipation of heat generated in the semiconductor device. Elevated temperatures may cause irreparable damage to the die and its electrical connections.

Various methods for preventing excessive temperatures in a semiconductor device have been in use.

Thus, for low-power devices of less than about 1 watt, the metal lead frame itself may be sufficient to dissipate generated heat. Lead frame configurations for improved heat dissipation are shown in U.S. Pat. No. 5,541,446 of Kierse, U.S. Pat. No. 4,961,107 of Geist et al., and U.S. Pat. No. 5,101,465 of Murphy.

For higher power packaged devices, a metal heat spreader may be incorporated into the package or attached to the outside of the package. Because of the generally low thermal conductivity of polymers, the heat dissipation design is more critical for polymer-packaged devices than for those packaged in ceramic or metal.

The use of heat spreaders/heat sinks/heat dissipaters in packaged semiconductor devices are often used conduct heat to the exterior of the devices, either directly or via the leads. A wide variety of such is illustrated in U.S. Pat. No. 5,596,231 of Combs, U. S. Pat. No. 5,594,282 of Otsuki, U.S. Pat. No. 5,598,034 of Wakefield, U.S. Pat. 5,489,801 to Blish II, U. S. Pat. No. 4,024,570 of Hartmann et al., U.S. Pat. Nos. 5,378,924 and 5,387,554 of Liang, U.S. Pat. No. 5,379,187 of Lee et al., U.S. Pat. No. 4,507,675 of Fujii et al., U.S. Pat. No. 4,642,671 of Rohsler et al., U. S. Pat. No. 4,931,852 of Brown et al., U.S. Pat. No. 5,173,764 of Higgins III, U.S. Pat. No. 5,379,186 to Gold et al., U.S. Pat. No. 5,434,105 to Liou, and U.S. Pat. No. 5,488,254 to Nishimura et al.

The above indicated references may be characterized as providing complex devices requiring difficult and/or costly processes to achieve the desired heat dissipation. Most of the references are not applicable at all to a high density device attached in a bare state to a substrate such as a circuit board.

Encapsulation compositions and methods are shown in U.S. Pat. No. 4,358,552 to Shinohara et al. and U.S. Pat. No. 5,194,930 to Papathomas et al.

BRIEF SUMMARY OF THE INVENTION

The present invention comprises a high density semiconductor device assembly for electrical connection without wires to a substrate such as a circuit board. In a preferred embodiment, the invention comprises a chip-on-board (COB) device with a heat spreader/dissipater on its back side. The active surface on its "front side" may be attached in a bare die state to the substrate by lead bond methods known in the art, preferably by ball-grid-array (BGA) methods which simultaneously complete each of the conductive bonds between die and circuit board.

The present invention also encompasses a "paddle frame" strip for (a) providing a heat spreader/dissipater on each die, (b) supporting the dice for die testing and/or (c) supporting the dice for applying conductive bumps to the bond pads. The paddle frame strip may incorporate any number of paddle frames, and preferably has at least eight paddle frames.

The present invention further comprises a method for producing the high density semiconductor device with the heat spreader/ dissipater.

The present invention provides significant advantages in the production of dense semiconductor devices, including enhanced reliability, ease of production, and reduced production costs.

BRIEF DESCRIPTION OF THE DRAWINGS

The invention is illustrated in the following figures, wherein the elements are not necessarily shown to scale.

DESCRIPTION OF THE ILLUSTRATED EMBODIMENTS

An improved high density semiconductor device assembly is provided by the present invention which is configured to be electrically attached to a substrate such as a circuit board by array bonding. A series of bare semiconductor devices of the invention may be mounted on a substrate in a closely packed arrangement. The semiconductor device is provided with a heat sink/spreading/dissipating member. Following mounting on a substrate, the device or plurality of devices may be "packaged" with a protective polymeric sealer.

The semiconductor device assembly and a method for producing it are described hereinbelow and illustrated in drawing FIGS. 1–5.

Figure 1:
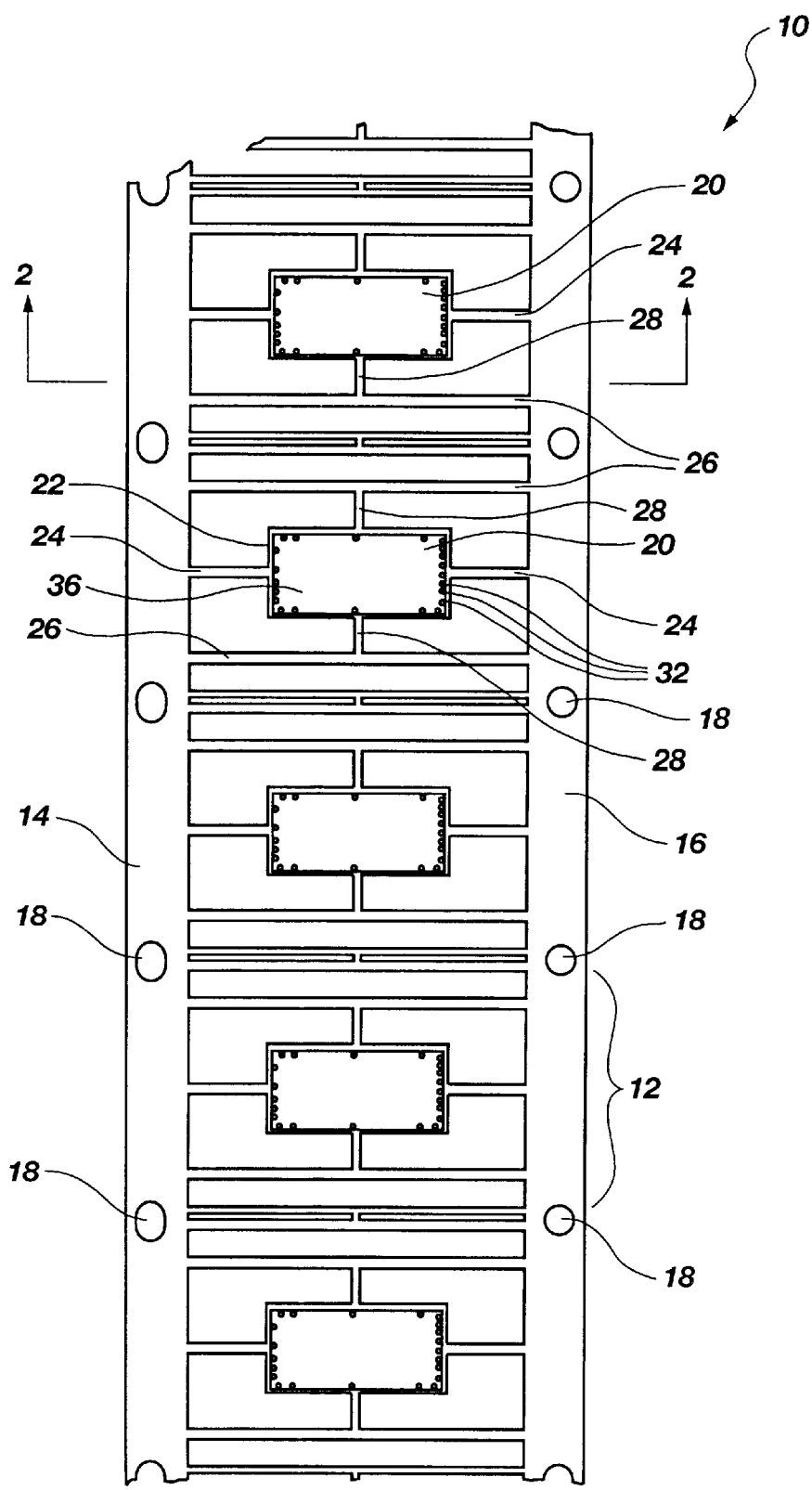
FIG. 1 is a plan view of a portion of a paddle frame and attached semiconductor dies of the heat spreading chip scale package of the invention.
Figure 2:
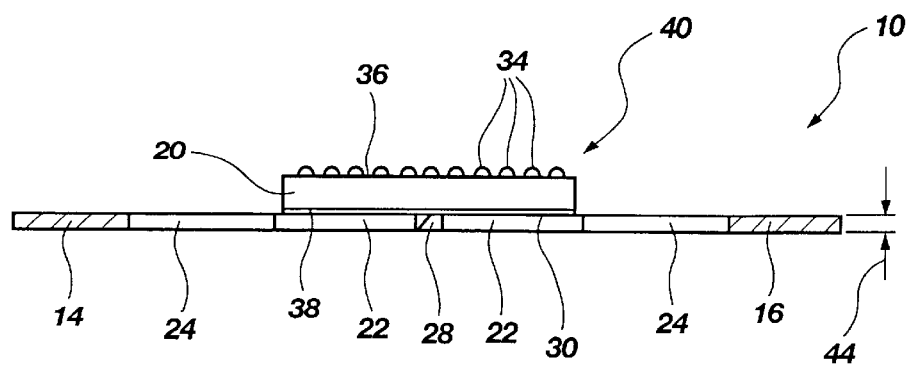
FIG. 2 is a cross-sectional side view of a die bonded to a paddle frame in accordance with the heat spreading chip scale package of the invention, as taken along line 2—2 of FIG. 1.

With reference to the drawings of FIGS. 1 and 2, a strip 10 of heat conductive material is configured with multiple frames 12. The strip 10 has left and right side rails 14, 16 and a series of sprocket holes 18 in the side rails for precise positioning of processing equipment and a plurality of dice 20 which are attached to the strip. Each frame 12 includes the side rails 14, 16, cross-members 26, and a generally centrally positioned paddle 22 which is attached to the side rails 14, 16 by paddle support bars 24 and to cross-members 26 by paddle support bars 28. A semiconductor die 20 having a first major surface 36 and an opposing second major surface 38 has surface 38 attached to a paddle 22 by die attach methods known in the art. Exemplary of such semiconductor die attachment methods is attachment using a layer 30 of electrically non-conductive polymeric adhesive such as epoxy or polyimide. Alternatively, a semiconductor die attach layer 30 may be electrically conductive. As known in the art, a metal filled polymer, an unfilled conductive polymer such as a silver filled epoxy or polyimide, or a conductive gold-silicon eutectic material may be used. Thus, the die attach layer 30 may be electrically conductive or insulative, depending upon the circuit configuration of the second major semiconductor die surface 38. Thus, for example, the second major surface 38 may be designed to be grounded to a ground plane surface, which may be the metal paddle 22.

The metal paddle 22 acts as a heat spreader/dissipater in the final semiconductor device 40 assembly. Thus, while the semiconductor die attach layer 30 may be either electrically conductive or insulative, it preferably has an enhanced heat conductivity. Where the paddle 22 comprises a metal layer attached to a polymer layer, the semiconductor die attach layer 30 is attached to the metal surface 48 to enhance heat transfer (see drawing FIG. 3).

Each metal strip 10 with paddle frames 12 may be formed in the same manner as are lead frames in the art. The number of paddle frames 12 which may be incorporated into the strip 10 is limited only by the capability of a manufacturer's machines for semiconductor die attachment and die excising.

The paddle frame 12 includes the left and right rails 14, 16 which are joined by cross-members 26. The generally centrally located paddle 22 is supported from the rails 14, 16 and cross-members 26 by paddle support bars 24, 28. Generally, no leads for electrical conduction are provided, although one or more of the paddle support bars 24, 28 may be used as leads in certain specific instances. No narrow "leads" common in lead frames are required in the paddle frame 12, resulting in greater ease of manufacture and increased reliability.

The paddle frame 12 may be formed of a thin film of metal such as aluminum, silver, copper, or Alloy "42". Typically, the paddle 22 is sized to completely cover the second major surface 38 of the die 20 and preferably be somewhat larger. The thickness 44 of the paddle 22 is a function of the quantity of generated thermal energy, the semiconductor die size, the thermal conductivity of the semiconductor die attach material, and whether a packaging material overlies the paddle 22 in the final product. For generally low rates of heat generation, the paddle thickness 44 may be the minimum required by structural considerations. However, where the heat generation rate is very high, it may be necessary to increase the thickness 44 to provide an increased heat sink capacity.

In many cases, the thickness 44 of the paddle 22 need only be sufficient to support the semiconductor die 20 prior to excision, and for uniform adherence to the semiconductor die 20. The thickness 44 may typically range from about 0.5 $\mu$m to about 5 $\mu$m, but may vary from this range, particularly upwardly for enhancing heat sink capability. This range of thickness 44 includes the typical thicknesses of lead frames of the prior art. Paddle frames 12 may be formed and joined to dice 20 by tape automated bonding (TAB).

Figure 3:
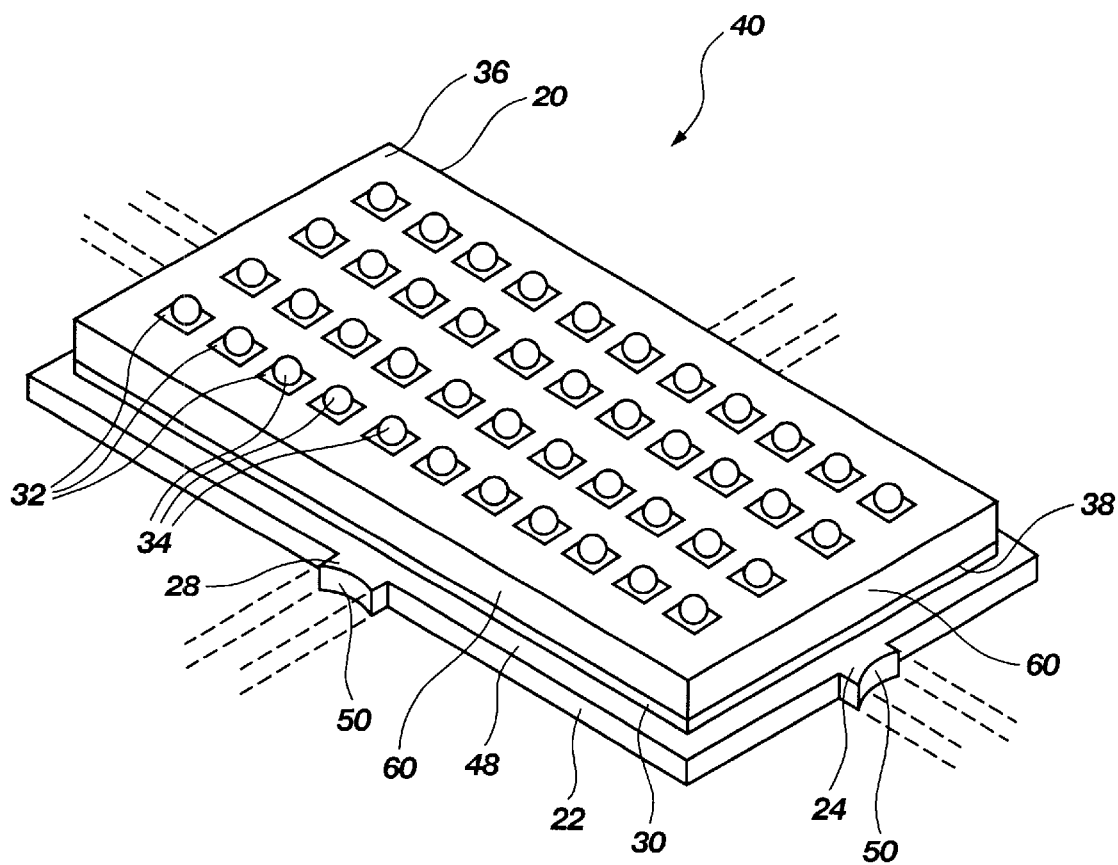
FIG. 3 is an enlarged perspective view of a semiconductor die bonded to a paddle of a paddle frame, furnished with a ball grid array and excised from the paddle frame in accordance with the chip scale package of the invention.

To singulate each semiconductor device 40 assembly, the paddle support bars 24, 28 are excised close to the paddle 22 with excisions 50 (see drawing FIG. 3). A illustrated in drawing FIG. 1, is a plurality of semiconductor dice 20 with conductive bond pads 32 on the first major surface 36, i.e. the "active" surface. While drawing FIG. 1 shows the bond pads 32 along the periphery of the dice, thus limiting the number of bond pads, the invention may be used for dice having a full grid array of bond pads as shown in drawing FIGS. 2 and 3.

Figure 4:
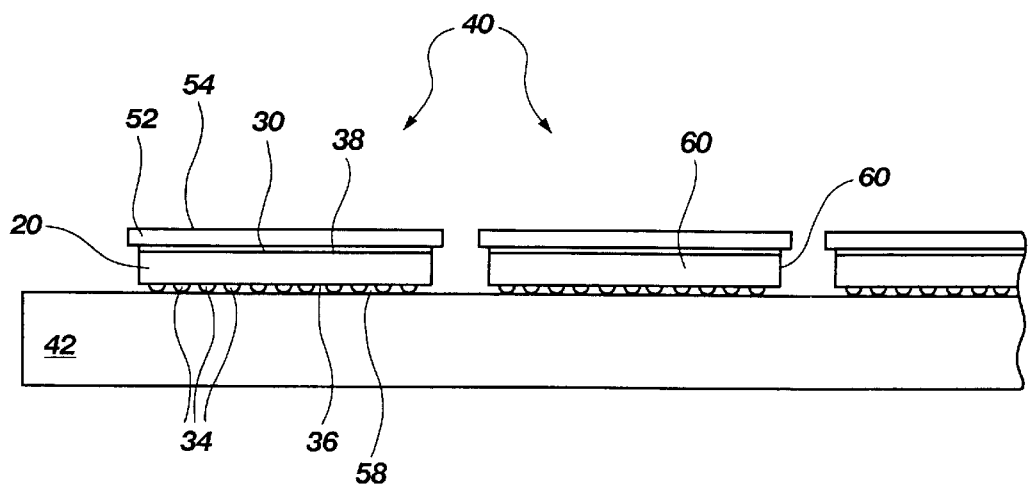
FIG. 4 is a side view of a circuit board upon which are reversibly mounted paddle-bonded semiconductor dies with ball grid arrays in accordance with the heat spreading chip scale package of the invention.
Figure 5:
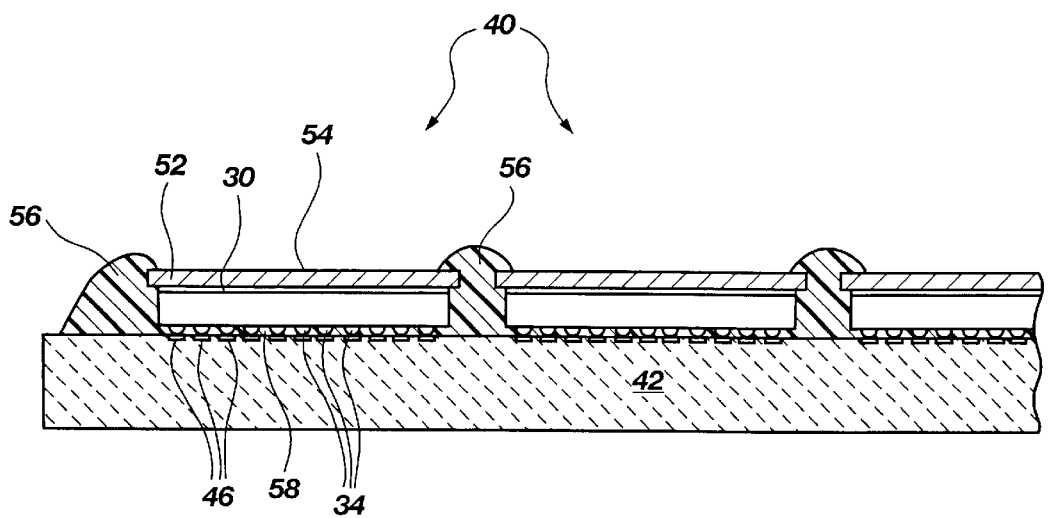
FIG. 5 is a cross-sectional side view of a circuit board upon which are reversibly mounted and resin-packaged paddle-bonded semiconductor dies with ball grid arrays, in accordance with the heat-spreading chip scale package of the invention.

In a preferred embodiment, conductive projections 34 such as solder bumps or balls are formed on the bond pads 32, the projections enabling "gang" bonding, i.e. flip-chip bonding, of the semiconductor die bond pads to the conductive traces 46 of a substrate 42 such as a circuit board This is illustrated in drawing FIGS. 4 and 5, which show a plurality of semiconductor devices 40 flipped and bonded to circuit connections, e.g. traces 46 (see drawing FIG. 5) of a substrate 42 comprising a substrate. The internal circuitry within the circuit board 42 is not shown, being irrelevant to the invention. The semiconductor devices 40 may be bonded to a substrate 42 in a high density pattern and, being "bare" semiconductor dice 20, take up minimal space. The bonding may be completed by standard "flip-chip" methods, including thermal and/or pressure processes.

Each semiconductor device 40 has a heat sink/spreader/dissipater 52 which was formerly a paddle 22 of a metal paddle frame 12. The heat sink/spreader/dissipater 52 has a generally exposed surface 54 for dissipating heat generated in the semiconductor device 40.

As depicted in drawing FIG. 5, a sealant 56 may be applied to the periphery of a device 40 and the space 58 between the device and the substrate 42. The sealant 56 seals the device 40 to the substrate 42 and protects the device from moisture, etc. The spaces between adjacent devices 40 may be readily filled with sealant 56. The space 58 may be filled, for example, by injecting sealant 56 through holes, not shown, in the substrate 42. Preferably, surface 54 of the heat sink/spreader/dissipater 52 is largely left uncovered to provide high heat dissipation.

Any sealant 56 useful in packaging semiconductor device assemblies may be used, including e.g. epoxy, polyimide, etc.

A method of producing the semiconductor device 40 includes the steps of:

1. producing a plurality of semiconductor dice 20 with integrated circuits as a wafer, each semiconductor die 20 having a first major surface 36 defined as an active surface with an array of conductive bond pads 32, i.e. input/output (I/O) pads, and a second, opposite major surface 38;
2. separating the individual semiconductor die 20 from the wafer;
3. providing a conductive "paddle frame" strip 10 with multiple paddle frames 12, each frame having a heat conductive paddle 22 connected to side rails 14, 16 and cross-members 26 of the frame 12 by paddle support bars 24, 28;
4. bonding a semiconductor die 20 to each paddle 22 of the paddle frame strip 10 with a thin die attach layer 30 of adhesive or adhesive tape of e.g. epoxy or polyimide. The die attach adhesive layer 30 may be provided with enhanced heat conductive properties. Alternatively, the second major surface 38 of the semiconductor die 20 may be bonded to the paddle 22 eutectically by formation of e.g. a gold-silicon eutectic layer 30 or other electrically conductive material such as a specially designed polyimide.
5. conductive projections 34, i.e. balls or bumps (stud bumps) for reflow may be formed on the I/O bond pads 32 of the semiconductor dice 20 either prior to or following attachment of the semiconductor dice to the paddles 22;

6. the semiconductor dice 20 may be tested in sequence in strip form, i.e. while the paddles 22 with attached dice are connected to the paddle frame strip 10. A test head (not shown) is placed to make temporary electrical connection with the conductive bond pads 32 or projections 34 for the conduction of parametric and functional tests, The testing may include additional tests typical of "burn-in" testing;

7. the paddle support bars 24, 28 connecting the paddles 22 to the paddle frame 12 are excised to free each semiconductor device 40;

The semiconductor devices 40 so produced are configured for mounting in a "flip-chip" configuration, i.e. face down on a substrate 42 such as a circuit board, e.g. by reflowing under heat and/or by pressure or other methods as known in the art.

The metal paddle 22 attached to the second major surface 38 of each semiconductor die 20 comprises a heat sink/spreader/dissipater 52 which prevents overheating of the semiconductor device 40 (a) during testing (including burn-in), (b) during mounting on the substrate 42, (c) during packaging, and (d) in actual operation.

Following attachment to a substrate 42 such as a circuit board, the semiconductor device 40 may be sealed with an electrically insulating sealant material 56 to produce a partially encapsulated package. The exposed surface 54 of the heat sink/spreader/dissipater 52 is preferably left largely uncovered, or is only thinly covered with the sealant material 56. The sealant may be any of the polymeric materials commonly used for packaging, including those used for "glob-top". Examples of such materials are epoxy resins and polyimides.

The invention is particularly applicable to high density integrated circuit semiconductor device assemblies 40 having a large number of interconnections, i.e. bond pads 32. Such devices may produce significant quantities of thermal energy which, if not removed, may lead to destruction of the integrated circuit. The bare semiconductor dice 20 of the invention may be densely mounted on a substrate 42 and then sealed by introducing a sealant material 56 between the substrate and semiconductor dice to surround the electrical connections and the first major active surfaces 36 and edges 60 of the semiconductor dice 20.

Major advantages of the invention are as follows:

1. The ease of device handling is enhanced. The dice 20 are fixed to the unseparated paddles 22 of the "paddle frame" 12 during the test process and each semiconductor device assembly 40 can be handled without touching the semiconductor die. Once the semiconductor device assembly 40 is separated from the paddle frame 12 by excision of the paddle support bars 24, 28, the paddle 22 becomes a heat sink/spreader/dissipater 52, and the device may be handled and supported solely thereby.

2. Current methods of lead frame production may be used to produce the paddle frame strip 10. The paddle frames 12 are much simpler in design than lead frames, there being few or no electrical leads.

3. Semiconductor dice or multiple chips 20 may be mounted on a single paddle frame strip 10, using equipment widely used by device manufacturers. Thus, reliable attachment of the semiconductor dice 20 to the paddles 22, testing (and burn-in) of the dice, separation of the paddle mounted semiconductor dice from the paddle frame strip 10, and mounting of the semiconductor dice on a substrate 42 may be easily accomplished using well-developed and common assembly equipment and methods. The readily aligned semiconductor die attach apparatus, test head, and lead excision apparatus enable accuracy and ease of operation in the device assembly.

4. The heat sink/spreader/dissipater 52 of the invention results in better temperature control and increased reliability of the semiconductor device assembly 40.

5. Use of known technology and equipment results in a lower assembly cost. No additional specially-designed equipment is required.

6. A dense chip-size bare semiconductor device assembly 40 of low profile is produced for dense attachment to a circuit board or other substrate 42.

It is apparent to those skilled in the art that various changes and modifications may be made to the die with heat spreader/dissipater and the novel method of manufacturing, testing and installing the die of the invention as disclosed herein without departing from the spirit and scope of the invention as defined in the following claims.

What is claimed is:

1. A method for manufacturing a semiconductor device assembly, comprising:

providing a substrate having at least one circuit on a first side thereof;

providing a semiconductor die having an active surface having at least one bond pad thereon and having a second surface;

providing a metallic paddle frame having left and right rails, opposing cross members connected to said left and right rails, and a paddle sized to cover said second surface of said semiconductor die connected to said left and right rails and said opposing cross-members, said paddle suspended between said left and right rails and said opposing cross-members for receiving said second surface of said semiconductor die thereon;

providing at least one conductive bump on said at least one bond pad on said active surface of said semiconductor die for connection to said at least one circuit on a first side of said substrate, said at least one conductive bump on said at least one bond pad of said semiconductor die forming a portion of a conductive ball-grid-array connection to said at least one circuit on a first side of said substrate;

attaching the second surface of said semiconductor die to said paddle;

disconnecting said paddle having said semiconductor die attached thereto from said paddle frame; and connecting said at least one conductive bump on said at least one bond pad of the active surface of said semiconductor die to said at least one circuit on a first side of said substrate forming a portion of a conductive ball-grid-array connection to said substrate, said paddle attached to said second surface of said semiconductor die providing a heat sink for said semiconductor die during the operation thereof.

2. The method of claim 1, further comprising:

testing said semiconductor die for satisfactory electrical properties while said paddle is connected to said metallic paddle frame.

3. The method of claim 1, wherein said substrate includes a circuit board having at least one circuit thereon.

4. The method of claim 1, wherein said semiconductor die is attached to said paddle by an electrically non-conductive material.

5. The method of claim 4, wherein said electrically non-conductive material includes a non-conductive adhesive material.

6. The method of claim 5, wherein said non-conductive adhesive material comprises a polymer.

7. The method of claim 5, wherein said non-conductive adhesive material comprises one of polyimide and epoxy.

8. The method of claim 5, wherein said non-conductive adhesive material comprises a polyimide tape.

9. The method of claim 5, wherein said non-conductive adhesive material comprises a polyimide tape having an adhesive coating on both sides thereof.

10. The method of claim 1, wherein said second surface of said semiconductor die is attached to said paddle by an electrically conductive material.

11. The method of claim 10, wherein said electrically conductive material comprises a eutectic material.

12. The method of claim 11, wherein said eutectic material comprises a gold-silicon eutectic layer.

13. The method of claim 2, wherein said substrate includes a substrate having a plurality of circuits formed thereon;

wherein said at least one conductive bump includes a plurality of conductive bumps on said plurality of bond pads on said active surface of said semiconductor die; and wherein said method further comprises connecting a plurality of conductive bumps to said plurality of circuits.

* * * * *